United States Patent [19]
Hsu

[11] Patent Number: 5,468,541
[45] Date of Patent: Nov. 21, 1995

[54] THIN FILM DELAMINATION TEST CHIP

[75] Inventor: Chen-Chung Hsu, Tai-Chung, Taiwan

[73] Assignee: United Microelectronics Coproration, Hsin Chu City, Taiwan

[21] Appl. No.: 117,571

[22] Filed: Sep. 7, 1993

[51] Int. Cl.[6] .................................................. B32B 9/00
[52] U.S. Cl. .......................... 428/210; 428/209; 428/901; 428/615; 428/620
[58] Field of Search ................................. 501/1; 428/209, 428/210, 901

[56] References Cited

U.S. PATENT DOCUMENTS 4,988,674  1/1991  Mir et al. ................................ 428/209

OTHER PUBLICATIONS

Charles Hong, Thin Film Cracking/Delamination Evaluation Using Assembly Test Chip, 1992 WLR Final Report, pp. 163–166.

Primary Examiner—Patrick J. Ryan
Assistant Examiner—Kam F. Lee
Attorney, Agent, or Firm—Meltzer, Lippe, Goldstein, et al.

[57] ABSTRACT

A delamination test chip comprises a semiconductor substrate and a plurality of layers stacked on the substrate. The delamination test chip is included in a die with one or more other chips. The die is packaged and subjected to environmental stress. The test chip includes an arrangement of conducting films and vias which enable the detection of a delamination and enable the identification of the particular layer at which the delamination occurs.

3 Claims, 2 Drawing Sheets

THIN FILM DELAMINATION TEST CHIP

FIELD OF THE INVENTION

The present invention relates to a delamination test chip for studying thin film delamination in a semiconductor structure. In particular, the present invention relates to a delamination test chip which can be used to identify the specific layer at which delamination occurs in a semiconductor structure.

BACKGROUND OF THE INVENTION

Thin Film Delamination (TFD) is a plastic package specific failure mechanism. When a thin film stack such as a semiconductor device is packaged, the thin film stack is exposed to moisture stress. Specifically, a moisture sensitive film reacts with moisture coming, for example, from the die edge. Adhesion of this moisture sensitive film weakens and delamination occurs when the film stack is under shear stress.

FIG. 1 illustrates thin film delamination. In FIG. 1, a semiconductor structure 10 comprises a substrate 12 and a plurality of thin films 14 stacked thereon. Illustratively, the substrate 12 is silicon, and the thin films 14 may be oxide layers, dielectric layers, metallization, poly, glass layers such as BPSG layers, etc. A shear stress 16 results in the delamination 20, wherein there is a separation along the boundary between two of the layers.

It is especially desirable to be able to test a semiconductor device fabrication and packaging process for Thin Film Delamination failure mechanisms. To perform such testing, one or more thin film delamination test chips are incorporated into a processed semiconductor Wafer. The wafer is then sawed into a plurality of die sizes. The dice are assembled in different plastic packages depending on die size and subjected to environmental stress. Each die has a delamination test chip which indicates whether or not there is delamination in that die.

A prior art delamination test chip for detecting thin film delamination is disclosed in Hong "Thin Film Cracking/Delamination Evaluation Using Assembly Test Chip." The prior art delamination test chip is illustrated in FIG. 2.

The delamination test chip 20 of FIG. 2, comprises a substrate 22 and a plurality of thin films. The thin films are labeled thin film #1, thin film #2, thin film #3, thin film #4, thin film #5, thin film #6, and thin film #7. Illustratively, each film corresponds to a film or layer in a semiconductor device formed on the same die as the delamination test chip. The test chip 20 comprises a "via/metal/poly chain" running up and down the stack of thin films.

Specifically, thin films #1, #3, #5, and #7 include polysilicon films 26 and the thin films #2, #4, and #6 include vias 28 which connect the polysilicon films 26. For example, each of the vias 26 in the film #2 connect the polysilicon film in the film #1 with one of the two polysilicon films in the film #3.

The delamination test structure 20 of FIG. 2 operates as follows. When there is no delamination there is a short between the two conducting layers in film #7 which function as probing contacts, because the "via/metal/poly" chain provides a conducting path between these conducting layers. However, when delamination occurs the via/contact chain is disturbed and there is a change in resistance between the two conducting layers in film #7.

A shortcoming of the delamination test chip shown in FIG. 2 is that it cannot be used to identify at which layer the delamination occurs. It is an object of the present invention to overcome this shortcoming by providing a delamination test chip which identifies at which layer in a thin film structure delamination occurs.

SUMMARY OF THE INVENTION

In accordance with the present invention, a test chip or test structure comprises a semiconductor or other substrate and a plurality of thin film layers formed on the substrate. An arrangement of conducting layers (metal or polysilicon) and vias are placed in the layers so that it is possible to determine at which layer delamination occurs.

Specifically, the arrangement of conducting layers and vias define a plurality of conducting paths. Each conducting path starts at a conducting layer in an upper one of the thin film layers, extends down to a particular one of the thin film layers and back to another conducting layer in the upper thin film layer. When a delamination occurs, the resistance of any path extending below the delamination is altered. However, the resistance of any path which is totally above the delamination remains unchanged as a result of the delamination.

DETAILED DESCRIPTION OF THE INVENTION

Figure 3:
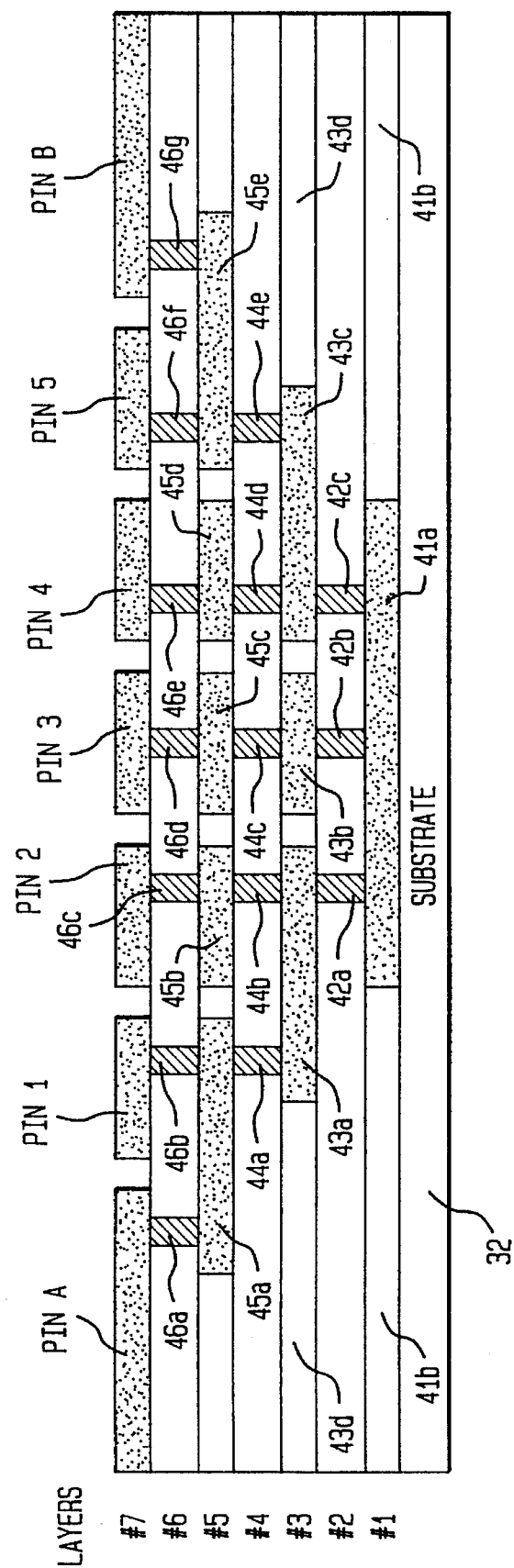
FIG. 3 illustrates a delamination test structure according to the present chip.

FIG. 3 schematically illustrates a delamination test chip 30 in accordance with the present invention. The delamination test chip 30 comprises a semiconductor substrate 32. A plurality of layers labeled #1, #2, #3, #4, #5, #6, #7 are stacked on top of the substrate 32. The layers are illustratively dielectric layers. The odd numbered layers contain conductive materials which are formed from metal or polysilicon. The layer #1 includes one conductive film 41a and dielectric film 41b. The layer #3 includes three conductive layers 43a, 43b, 43c and dielectric film 43d. The layer #5 includes five conductive layers labeled 45a, 45b, 45c, 45d, 45e. The layer #7 includes seven contacts or pins labeled pin A, pin B, pin 1, pin 2, pin 3, pin 4, pin 5. The even numbered layers contain vias which are formed from conducting material. The layer #2 includes vias 42a, 42b, 42c. The layer #4 contains vias 44a, 44b, 44c, 44d, 44e. The layer #6 contain vias 46a, 46b, 46c, 46d, 46e, 46f, 46g. Each via connects one conductive film in the layer above it to a conductive film in the layer below it.

Each conducting film and via is surrounded by dielectric films which provide dielectric isolation for the vias and conducting films.

For example, via 42a connects the conductive film 43a to the conductive film 41a.

The conductive layers and vias define a plurality of conducting paths. For example, the path between pin A or pin B, contains pin A, via 46a, conductive film 45a, via 44a, conductive film 43a, via 42a, conductive film 41a, via 42c, conductive film 43c, via 44e, conductive film 45e, via 46g, and pin B. The path between pin A and pin 1 includes pin A, via 46a, conductive film (or metal film) 45a, via 46b and pin 1. The path between pin A and pin 2 includes pin A, via 46a, conductive film 45a, via 44a, conductive film (or poly 2) 43a, via 44b, conductive film (or metal I) 45b, via 46c and pin 2.

Figure 1:
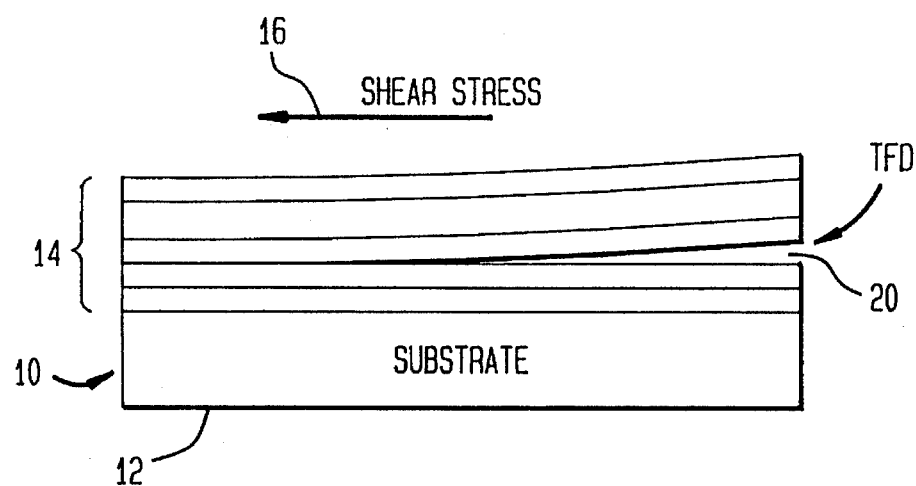
FIG. 1 illustrates delamination in a thin film device.
Figure 2:
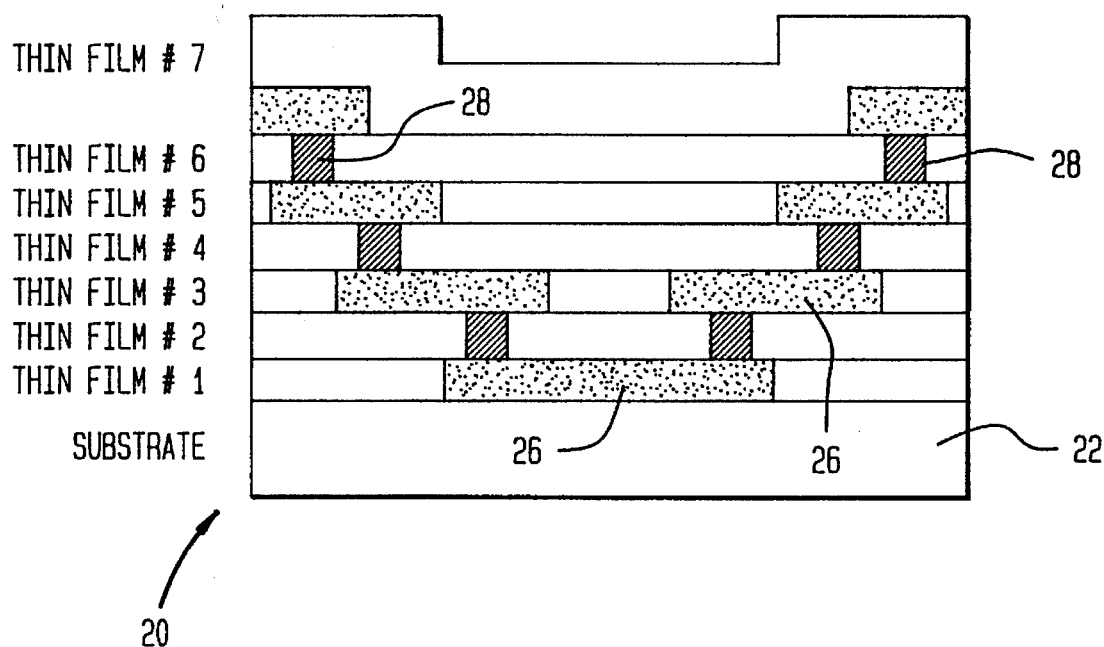
FIG. 2 illustrates a prior art delamination test chip.

The path between pin A and pin B is similar to the conducting path of the prior art test chip of FIG. 2. If there is no delamination there is a short between pin A and pin B. If there is a delamination, the resistance between pin A and pin B is altered, regardless of where the delamination occurs. This is because the path between pin A and pin B extends to the lowermost layer (layer #1) and any delamination will take place at or above this layer. Thus, the path between pin A and pin B can be used to identify that a delamination occurs but cannot be used to identify the particular layer at which the delamination occurs.

To identify where a delamination occurs, the other paths involving the test pins, e.g., pin 1, pin 2, may be used.

Consider the example where a delamination occurs at layer #2 so that all the vias (42a, 42b, 42c) in layer #2 are broken. In this case the resistance in the path between pin A and pin B (or in the path between pin A and pin 3) will be altered because this path extends below the delamination. However, the resistance in the path between pin A or pin 2 will not be altered, since this path is entirely above the delamination. Similarly, the resistance of the path between pin A and pin 1 will not be altered. Thus, this pattern of altered and unaltered resistances indicates a delamination at layer #2.

Now consider the core of a delamination at layer #4 so that all the vias (44a, 44b, 44c, 44d, 44d) in layer #4 are broken. In this case, the resistance of the path between pin A and pin B will be altered because this path extends below the delamination. The resistance of the path between pin A and pin 2 will also be altered because this path extends below the delamination. However, the resistance of the path between pin A and pin 1 is not altered, as this path is entirely above the delamination. Thus, this pattern of altered and unaltered resistances indicates a delamination in layer #4.

In short, a delamination test chip which indicates the particular layer at which a delamination occurs has been disclosed. The inventive structure can be used to monitor delamination resulting from a variety of sources including thermal shock, temperature cycling, temperature humidity, vibration, mechanical shock, solderability, etc.

Finally, the above described embodiment of the invention is intended to be illustrative only. Numerous alternative embodiments may be devised by those skilled in the art without departing from the scope of the following claims.

I claim:

1. A delamination test structure comprising:

a substrate, a plurality of thin films stacked on said substrate, a plurality of conductive films and vias incorporated in said thin films, and a plurality of conductive paths formed from said plurality of conductive films and vias, said plurality of conductive paths detecting a delamination in said thin films and detecting at which specific thin film the delamination occurs.

2. The delamination test structure of claim 1 wherein said substrate is a semiconductor substrate.

3. The delamination test structure of claim 1 wherein each one of said plurality of conductive paths extends from a contact in an upper one of said thin films down to a particular thin film in said stack of thin films and back to another contact in said uppermost thin film, so that when a delamination occurs, the resistance of any path extending below said delamination will be altered, but the resistance of any path which is above said delamination will not be altered as a result of the delamination.

\* \* \* \* \*